United States Patent [19]
Sahin et al.

[11] Patent Number: 5,626,678
[45] Date of Patent: May 6, 1997

[54] NON-CONDUCTIVE ALIGNMENT MEMBER FOR UNIFORM PLASMA PROCESSING OF SUBSTRATES

[75] Inventors: Turgut Sahin, Cupertino; David W. Cheung, Foster City, both of Calif.

[73] Assignee: Applied Materials, Inc., Santa Clara, Calif.

[21] Appl. No.: 492,659

[22] Filed: Jun. 20, 1995

Related U.S. Application Data

[63] Continuation of Ser. No. 187,279, Jan. 25, 1994, abandoned.
[51] Int. Cl.⁶ .................................................... C23C 16/50
[52] U.S. Cl. ........................ 118/723 E; 118/728; 156/345
[58] Field of Search ........................ 118/728 E, 728; 156/345

[56] References Cited

U.S. PATENT DOCUMENTS 4,767,641  8/1988  Kieser .................... 118/723 E
5,352,294  10/1994  White ...................... 118/728

FOREIGN PATENT DOCUMENTS 3-127822  5/1991  Japan .................. 118/723 E

*Primary Examiner*—Richard Bueker
*Attorney, Agent, or Firm*—Ashok K. Janah; Michael B. Einschlag

[57]  ABSTRACT

A new susceptor design for used in plasma processing of substrates is provided. The susceptor is made of metal and serves as one of the electrodes in a parallel plate plasma reactor. The susceptor is flat and has no lip at its rim. A substrate having substantially the same diameter as the susceptor is placed on and covers the susceptor. This arrangement allows a uniform electric field to be formed across the whole surface of the substrate. As a result, the deposition on the surface of the substrate is uniform.

32 Claims, 5 Drawing Sheets

5,626,678

NON-CONDUCTIVE ALIGNMENT MEMBER FOR UNIFORM PLASMA PROCESSING OF SUBSTRATES

CROSS-REFERENCE TO RELATED APPLICATIONS

This application is a continuation of U.S. application Ser. No. 08/187,279 filed Jan. 25, 1994, now abondoned.

The present invention relates generally to an apparatus for depositing a thin layer of material on a surface, and more particularly to a plasma-enhanced deposition apparatus for providing a layer of film of high uniformity on the surface.

BACKGROUND OF THE INVENTION

One of the most widely used deposition methods in semiconductor fabrication is chemical vapor deposition. In chemical vapor deposition (CVD), gaseous molecules in the form of reactant gases are introduced into a reactor and undergo chemical reactions for conversion into the desired deposit material. For example, $SiH_4$ molecules decompose into silicon atoms (the desired deposit material) and $H_2$ molecules. The silicon atoms are adsorbed on the surface of a substrate and the $H_2$ molecules desorb or leave the surface. The adsorbed silicon atoms eventually become chemically bonded to the substrate and form a layer of silicon on the surface.

Early CVD methods used a relatively high temperature and thermally-activated chemistry to deposit material from a reactant gas onto a heated substrate positioned inside a reactor. It was found that some of the CVD processes could be "enhanced" by adding plasma to the reactant gas. The term plasma, as used in CVD processes, means a partially ionized gas.

In semiconductor processes, only a small fraction of the reactant gas needs to be ionized. However, the plasma reactor contains a large percentage of species called radicals, which are highly reactive excited gas species. These radicals, which do not normally exist without a plasma, are created by gas phase collisions with electrons and/or ionized species driven by an electric field. As a result, some CVD processes can use plasma enhancement to increase the reaction rate of a chemical reaction, or drive a chemical reaction that does not occur at all without the plasma. For example, many processes do not occur if the temperature is too low, unless assisted by the presence of a plasma.

As a result of plasma-enhanced deposition techniques, low temperature CVD processes have been developed for forming diverse materials, including metals such as aluminum and tungsten, dielectric films such as silicon nitride and silicon dioxide, and semiconductor films such as silicon. The low temperature method is desirable because higher temperature may damage substrate structure. However, one of the problems of prior art plasma-enhanced deposition systems is that deposition near the rim of a substrate is not uniform.

Plasma is generated by applying an electric field of sufficient intensity to a gas. A common configuration is to apply a high voltage power source to a pair of parallel electrodes to generate the necessary electric field. When appropriate conditions are reached (e.g., the voltage across the electrodes and the pressure of the gas are at a certain value), some of the gas molecules become ionized and a plasma is formed.

In semiconductor processing, a metal susceptor (for holding a substrate and transmitting heat thereto) is usually used as one of the electrodes. This arrangement simplifies the design of a reactor because the same component can be used for multiple purposes. It makes full use of the properties of metal, i.e., is a good thermal conductor (the metal susceptor can conduct heat from a heat source to the substrate efficiently) and is a good electrical conductor (it can function as an electrode). In this arrangement, an upper electrode is typically connected to a radio frequency source and the metal susceptor is grounded. The difference in potential between the upper electrode and the grounded susceptor creates the electric field which generates a plasma.

It is desirable to have a uniform electric field oriented essentially perpendicular to the metal susceptor, and consequently the substrate. The uniform electric field allows plasma and radicals to be formed uniformly across the span of the surface of the substrate. As a result, the deposition of material on the surface of the substrate is also uniform.

The metal susceptor also functions as a holder for supporting the substrate and normally has a lip around the rim for preventing the substrate from moving outside of the susceptor. However, the lip causes the electric field to deviate from a uniform and perpendicular geometry at the region near the lip. As a result, the layer of deposited material near the rim of the substrate is usually not uniform. Consequently, there is a need for a system which is able to render the deposition uniform even at the rim of the substrate.

SUMMARY OF THE INVENTION

Broadly stated, the invention is a plasma chamber assembly for processing substrates in an environment containing an ionizable gas. The assembly contains a thermally and electrically conductive support for supporting a substrate to be processed within the chamber so as to expose a surface of the substrate to the environment. The support is generally of the same diameter as the substrate. The support has a substrate supporting surface which is complementary to a corresponding surface of the substrate. The assembly also contains a non-conductive aligning member disposed about the periphery of the conductive substrate support. The aligning member extends transversely with respect to the substrate supporting surface to insure registration of the substrate with the supporting surface. The assembly includes an electrode spaced evenly from and in facing relationship to the supporting surface. The electrode and the conductive support are adapted to be energized so as to establish an electric field having good uniformity between the electrode and the supporting surface. As a result, a plasma may be established within the chamber and the processing of the substrate surface may proceed with enhanced uniformity over the surface.

The foregoing and other aspects of the invention will be more fully understood from the following description of the invention when read in conjunction with the accompanying drawings.

DETAILED DESCRIPTION OF THE INVENTION

Figure 1:
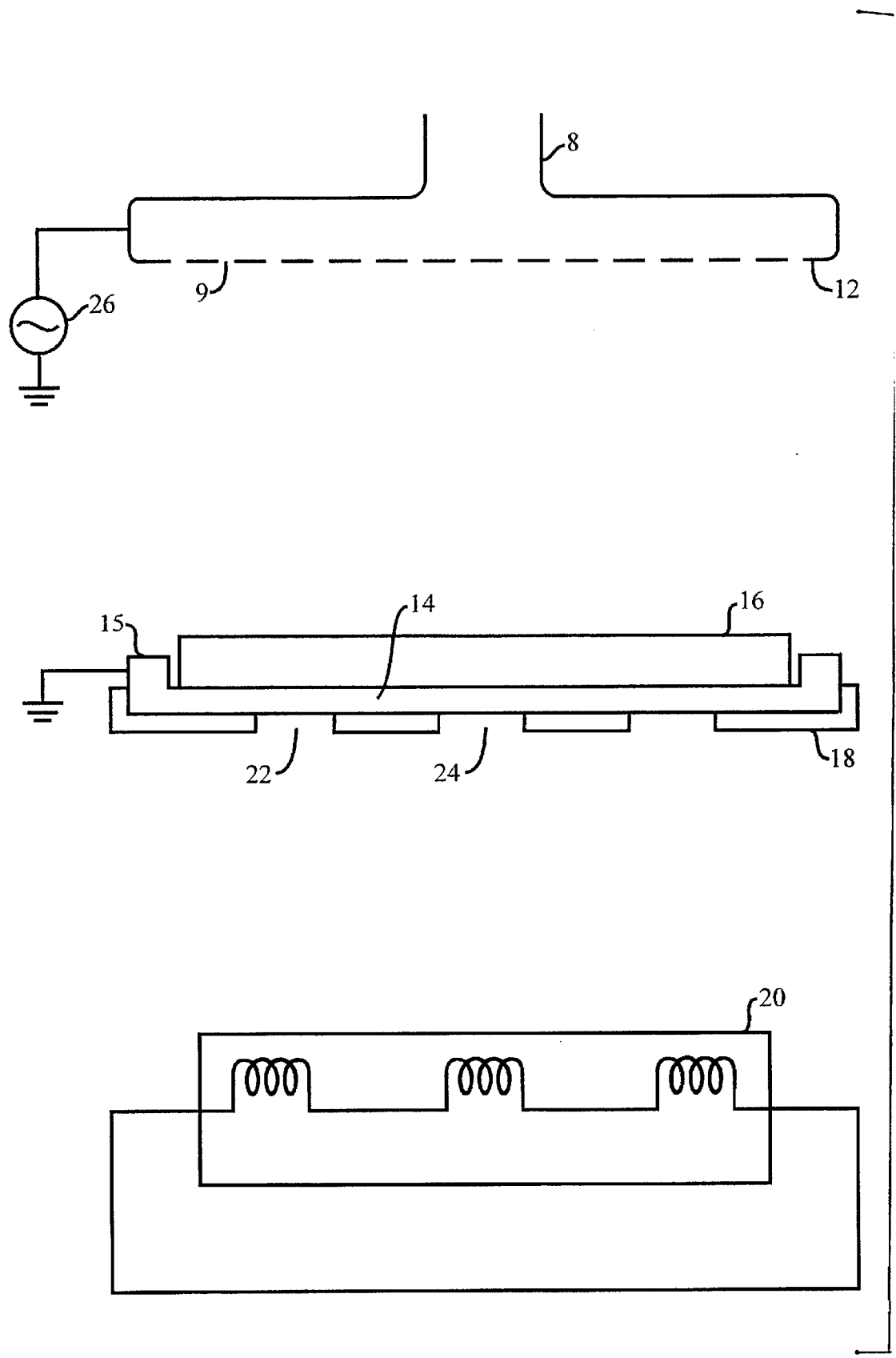
FIG. 1 is a schematic drawing of a prior art plasma-enhanced chemical vapor deposition reactor.

FIG. 1 is a schematic drawing of a prior art plasma enhanced CVD reactor 1. Reactor 1 comprises an electrode 12, an aluminum susceptor 14 for holding a substrate, such as silicon wafer 16, a ceramic support 18 positioned under aluminum susceptor 14, and a radiant heater, such as a bank of tungsten-halogen cycle lamps 20, for providing heat to wafer 16. Typically, electrode 12 includes a gas inlet 8 and a plurality of apertures, such as aperture 9, for uniformly injecting reactant gases into reactor 1. The reactant gases are capable of producing desired materials, typically at a temperature of a few hundred degrees, for deposition on the surface of wafer 16.

Wafer 16 can also be heated resistively instead of radiatively. In this case, resistive heating means, well known in the art, may be used instead of lamps 20. If the deposition temperature is at room temperature, no heating means is required.

Ceramic support 18 is used to provide mechanical support to aluminum susceptor 14 because the mechanical strength of aluminum decreases as temperature increases. Also, susceptors are typically of thin metal construction for better transport of heat from below to the wafer. Aluminum susceptor 14 has a lip 15 for confining wafer 16 within its perimeter. Ceramic support 18 preferably has a plurality of holes, such as holes 22 and 24, so that aluminum susceptor 14 is directly exposed to light generated by bank 20. This arrangement allows direct heating of aluminum susceptor 14 instead of relying on conduction of heat from ceramic support 18 to aluminum susceptor 14.

Electrode 12 is connected to a radio frequency (RF) power source 26 while aluminum susceptor 14 is connected to ground. RF power source 26 generates an electric field running between electrode 12 and aluminum susceptor 14. This electric field ionizes the reactant gases inside reactor 1 and forms a plasma. The ionized reactant gases and radicals undergo chemical reactions and generate material which eventually is deposited on wafer 16.

It has been found that deposition may be improved by connecting two RF power sources of different frequencies (e.g., a 13.56 MHz source and a source between 100 KHz and 450 KHz) to electrode 12. It is possible to connect the RF power sources to susceptor 14 while electrode 12 is grounded. It is also possible to connect one RF source to susceptor 14 and another RF source to electrode 12.

During the operation of plasma-enhanced deposition, heat may be generated as a result of chemical reaction. However, the heat generated from deposition is relatively small, when compared with heat generated from other applications, such as etching. Consequently, there is no need to have complicated arrangements (such as clamping the wafer to the susceptor) for dissipating heat from the wafer during deposition.

Figure 2A:
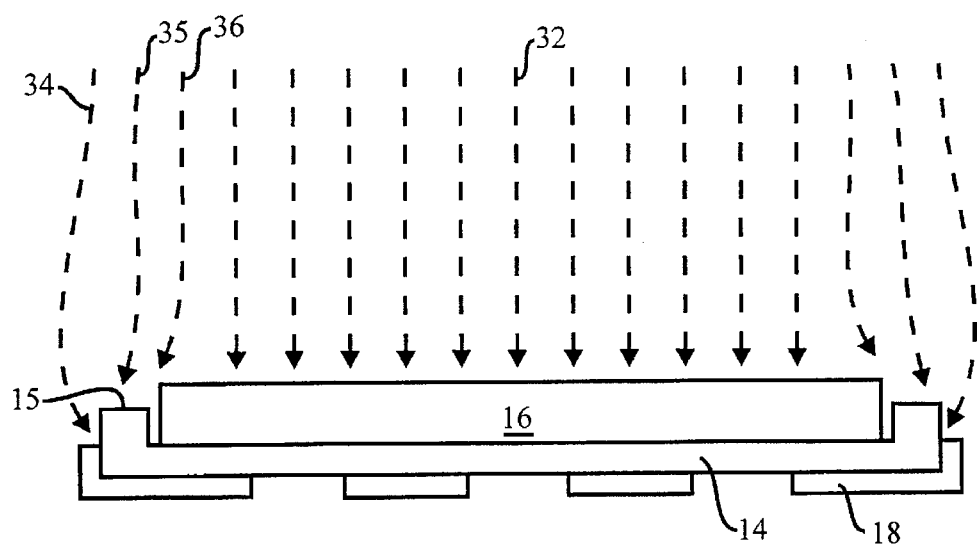
FIG. 2A is a drawing showing the electric field configuration of the reactor shown in FIG. 1.

FIG. 2A is a drawing showing the electric field configuration near wafer 16. It is known that the configuration of the electric field is affected by the location and geometry of conductors in and near the field. When the electric field is generated by a pair of parallel plates, the electric field runs perpendicular to the plates. In reactor 1 of FIG. 1, electrode 12 and aluminum susceptor 14 form a pair of parallel flat plates. Consequently, the electric field near the center of the wafer, such as field 32, is perpendicular to wafer 16.

The electric field near lip 15 of aluminum susceptor 14, such as field lines 34–36, is affected by lip 15. Lip 15 causes channelling of the electric field away from a perpendicular orientation and the bending of the electric field towards lip 15. As a result, the electric field lines around lip 15 deviate from straight lines. The channelling of electric field affects the movement of ionized reactant gases, which in turn affects the density of material deposited on wafer 16.

Figure 2B:
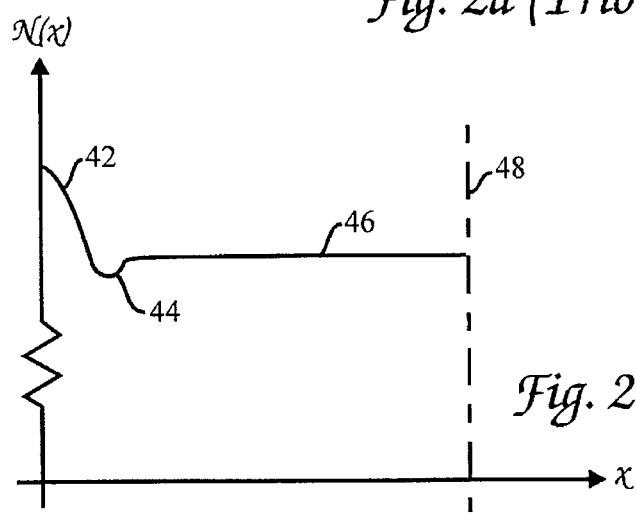
FIG. 2B is a drawing showing the plasma density of the reactor shown in FIG. 1.

FIG. 2B is a drawing showing the plasma density n(x) as a function of distance x from lip 15 of aluminum susceptor 14. The plasma density 42 around lip 15 is higher than the plasma density 46 near the axis 48 of wafer 16. On the other hand, the plasma density 44 at a small distance away from lip 15 is lower than plasma density 46 near axis 48.

Figure 2C:
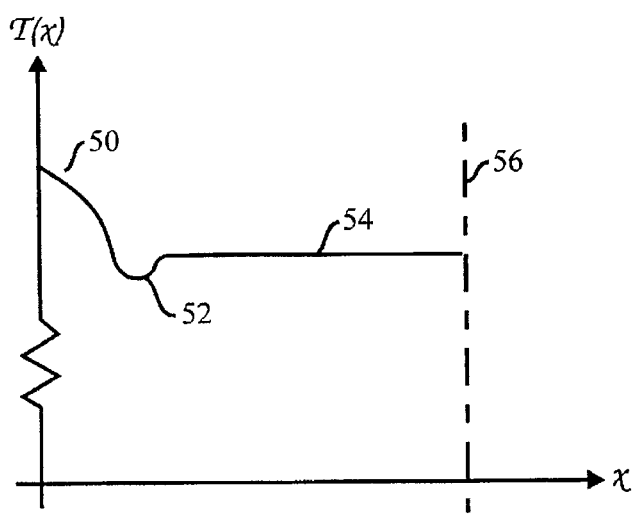
FIG. 2C is a drawing showing the thickness of deposited material on a wafer in a reactor shown in FIG. 1.

FIG. 2C is a drawing showing the thickness T(x) of deposited material on wafer 16 as a function of distance x from lip 15 of aluminum susceptor 14. The thickness 50 around lip 15 is typically more than 10% above the thickness 54 near the axis 56 of wafer 16. The thickness 52 at a small distance from lip 15 is typically about 10% below thickness 54. For a wafer with a radius of 100 mm, the distance covered by thickness 50 and 52 is typically 15 to 20 mm. Thus, up to 20% of the wafer diameter may be unusable because of the nonuniformity in deposition.

Figure 3:
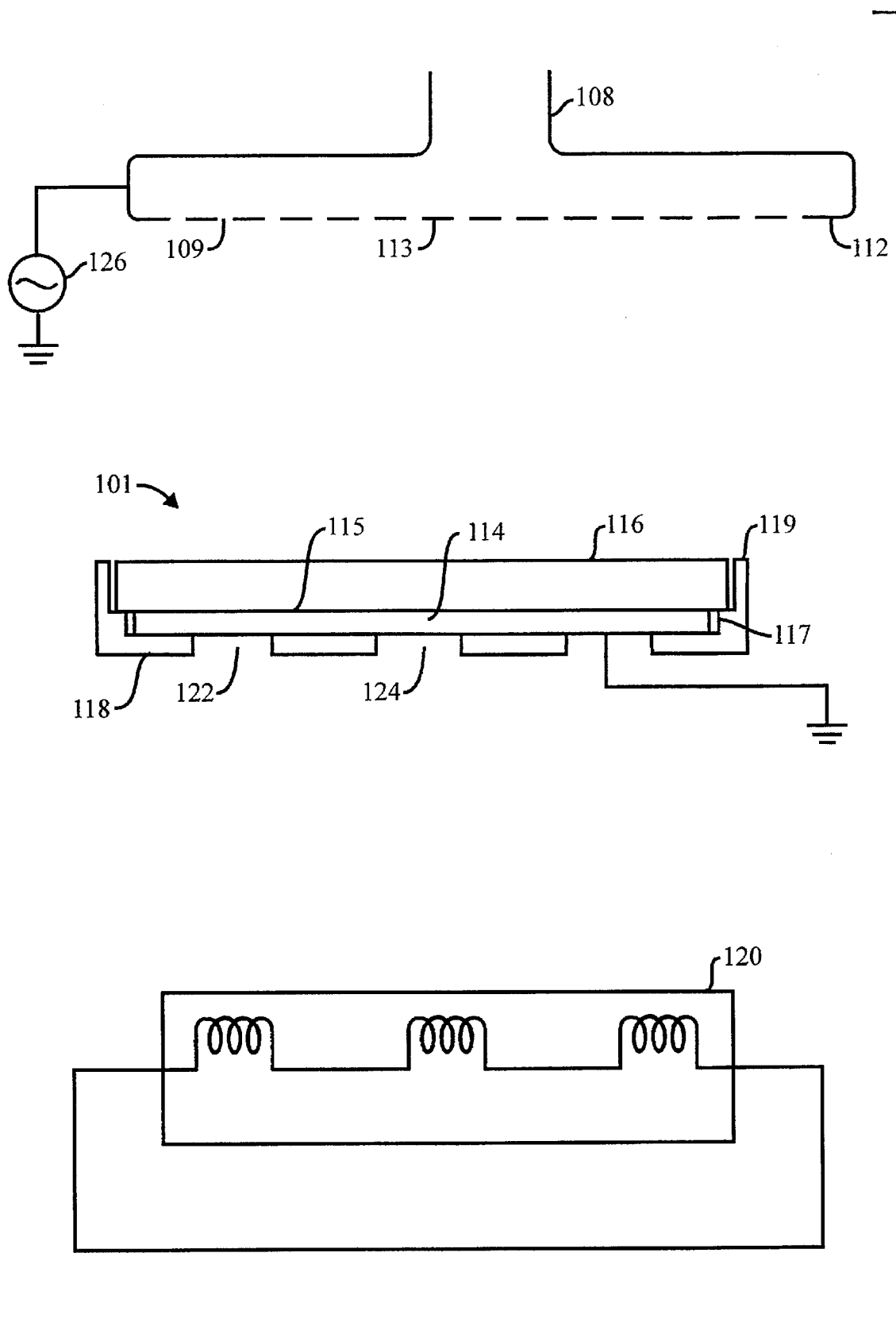
FIG. 3 is a schematic drawing of a plasma-enhanced chemical vapor deposition reactor in accordance with the present invention.

FIG. 3 is a schematic drawing of a plasma enhanced CVD reactor 101 in accordance with the present invention. Reactor 101 comprises an electrode 112, a metal susceptor 114, support means 118 for supporting metal susceptor 114 and a substrate, such as a silicon wafer 116, and a radiant heater, such as a bank of tungsten-halogen cycle lamps 120, for providing heat to wafer 116. Electrode 112 preferably includes a gas inlet 108 and a plurality of apertures, such as aperture 109, for uniformly injecting reactant gases into reactor 101. Wafer 116 may be heated resistively instead of by lamps 120. For the case where deposition occurs at room temperature, no heating means is needed.

Examples of reactant gases that can be advantageously used in reactor 101 are $SiH_4$, $NH_3$, $N_2$, $N_2O$, TEOS, $H_e$, and $O_2$. These gases flow into the reactor in the range generally from 50 to 3,000 sccm. Reactor pressure is typically maintained at around 1 to 10 torr. Wafer temperature is preferably maintained at 25° C. to 475° C.

Electrode 112 is connected to a power source 126. A RF source is preferably used. However, it is also possible to use a DC source. Metal susceptor 114 is connected to ground. In this arrangement, metal susceptor 114 functions as one of the plates of a parallel plate plasma generator. Two power sources with different frequencies (e.g., a 13.56 MHz source and a source between 100 KHz and 450 KHz) may also be connected to electrode 112. Further, the generation of electric field and plasma depends only on the electrical potential between electrode 112 and susceptor 114 and does not depend on their respective polarities. Thus, it is possible to ground electrode 112 and connect the power source(s) to metal susceptor 114. It is also possible to connect one RF source to electrode 112 and another RF source to susceptor 114.

The electrical potential developed across metal susceptor 114 and electrode 112 generates an electric field which is perpendicular to these two plates. This electric field causes a plasma to be generated. The frequency of the RF power is preferably 13.56 MHz, although a different frequency can also be used. The intensity of the RF power is preferably between 50–1500 watts for currently available wafers. The preferred intensity depends on the size of wafer 116 and the gas flow, and is not limited to the above range.

In one embodiment of the invention, metal susceptor 114 is made of aluminum. Aluminum is chosen because it is easy to machine. However, other conductive materials can be used if they can withstand the reaction environment and can be machined at reasonable cost.

The surfaces of electrode 112 and metal susceptor 114 that face each other, i.e., surfaces 113 and 115, respectively, are preferably flat. One advantageous aspect of the present invention is that metal susceptor 114 does not contain a lip. Thus, electrode 112 and metal susceptor 114 form a parallel plate geometry which is close to the ideal for maintaining a uniform electric field across the wafer. As a result, the present invention almost eliminates the channeling effect which introduces nonuniformity in the electric field of prior art reactors.

The electric field may also be affected by materials (such as reactant gases and the substrate) placed between electrode 112 and metal susceptor 114. This is because different materials have different dielectric constants which affect the relationship between the intensity of the electric field and the electrical potential applied across the parallel plates. In order to generate a uniform electric field across the surface of metal susceptor 114, it is important that the materials placed between electrode 112 and metal susceptor 114 be the same across the surface.

Wafer 116 preferably has a thin substantially disk shape. Its diameter is slightly larger than the diameter of metal susceptor 114. It should be placed on top of metal susceptor 114 so that the whole surface 115 of metal susceptor 114 is covered by wafer 116. Thus, electrode 112 and the entire surface 115 of metal susceptor 114 are separated by materials (i.e., wafer 116 and reactant gas) having the same dielectric constant.

Metal susceptor 114 is held in a lower containment region 117. Wafer 116 is kept centered on susceptor 114 by a lip 119 on support means 118 such that wafer 116 covers the entire surface of susceptor 114 and part of the edge wall of the lower containment region 117. In order to ensure that most of the surface of wafer 116 is exposed to a uniform electric field, the dimensions of lip 119, lower containment region 117 and metal susceptor 114 are designed so that only a small region near the rim of wafer 116 does not overlap the diameter of metal susceptor 114. An example of the sizes of wafer 116 and metal susceptor 114 are: (1) diameter of wafer 116 is 200 mm (with tolerance of about 0.5 mm) and (2) diameter of metal susceptor 114 is 196 mm. The diameter of containment region 117 is preferably between 197 mm and 198 mm.

Support means 118 may have other shapes. One of the important features of support means 118 is to align wafer 116 to susceptor 114 so that the entire surface 115 of metal susceptor 114 is covered by wafer 116. In this embodiment, support means 118 functions as a means for providing mechanical support to both wafer 116 and susceptor 114 as well as a means for aligning wafer 116 to susceptor 114.

Support means 118 is preferably made of ceramic. However, it can be made of other non-conductive material that can maintain mechanical strength at high temperature and have minimal effect on the electric field between metal susceptor 114 and electrode 112.

Preferably, support means 118 has a plurality of holes (such as holes 122 and 124) so that metal susceptor 114 is directly exposed to light generated by light bank 120. As a result, there is no need to rely exclusively on heat conduction through support means 118. If wafer 116 is heated by resistive heating, or if no heating is needed, it is not necessary for support means 118 to have holes.

As a result of the above described design, the electric field between electrode 112 and metal susceptor 114 is uniform over substantially the entire surface of wafer 116. This electric field ionizes the reactant gases inside reactor 101. The ionized reactant gases and/or the radicals undergo chemical reactions and generate material which eventually is deposited uniformly on wafer 116.

Even though the preferred cross-sectional area of wafer 116 and metal susceptor 114 is circular, it should be obvious to a person skilled in the art that other shapes can also be used. For example, a wafer having a thin prismatic shape (i.e., a polyhedron having two faces that are polygons in parallel planes while the other faces are parallelograms) disposed on a metal susceptor having the same cross-sectional area will lead to uniform electric field oriented perpendicular to the wafer.

Figure 4:
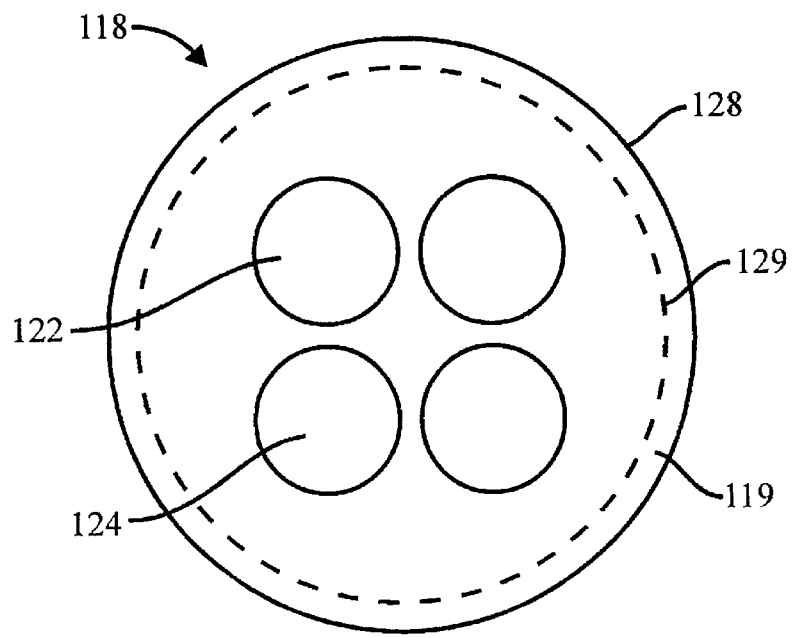
FIG. 4 is a drawing of the bottom view of a support means in the deposition reactor of FIG. 3.

FIG. 4 is a bottom view of support means 118 with heat transfer holes, such as holes 112 and 124. The portion of support means 118 bounded by outer perimeter 128 and dash circle 129 corresponds to lip 119.

Figure 5A:
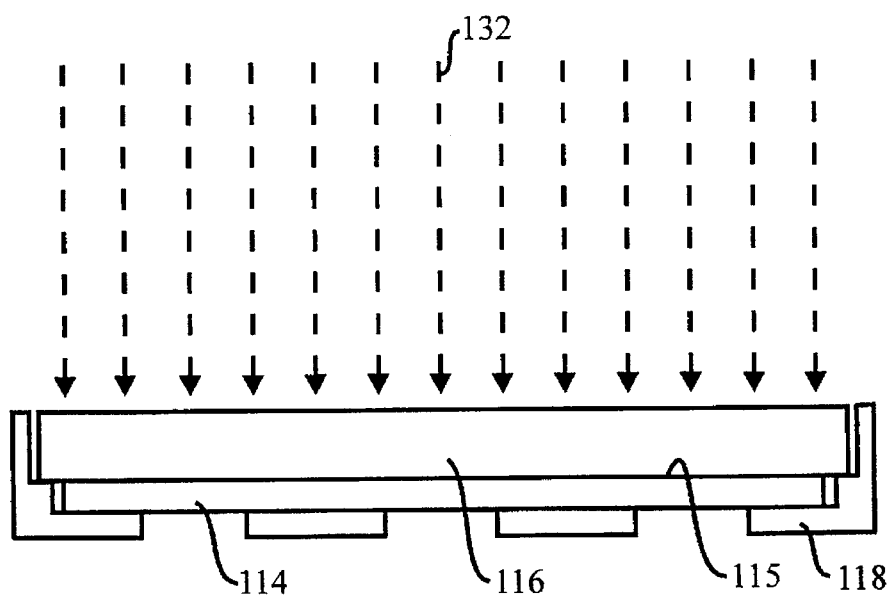
FIG. 5A is a drawing showing the electric field configuration of the reactor shown in FIG. 3.

FIG. 5A is a drawing showing the electric field configuration near substrate 116. As mentioned above, electrode 112 and metal susceptor 114 are essentially flat and parallel. Further, wafer 116 covers the whole surface 115 of metal susceptor 114. Thus, the electric field lines (such as line 132) are substantially perpendicular and uniform over the whole substrate 116. It should be pointed out that the field line near the rim of metal susceptor 114 deviates slightly from straight line because any discontinuity (such as at the rims of metal susceptor 114 and/or wafer 116) has an effect on the electric field. However, the deviation from straight line in reactor 101 is much less than the deviation in a prior art reactor.

Figure 5B:
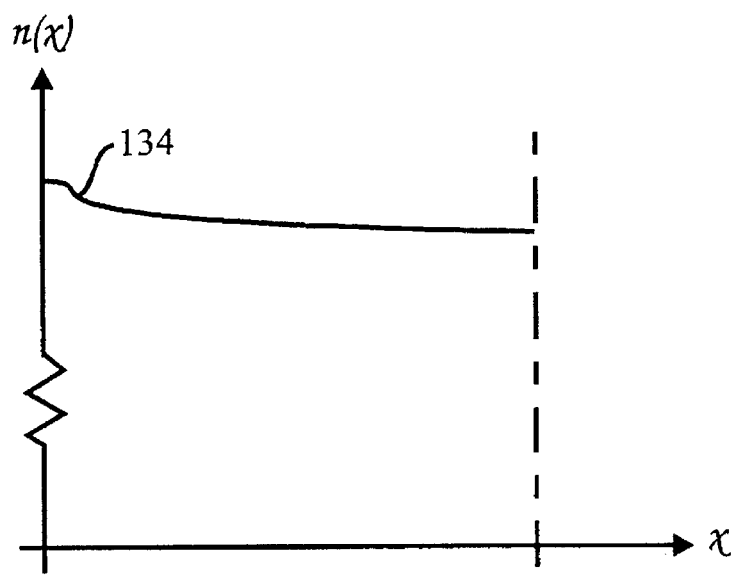
FIG. 5B is a drawing showing the plasma density of the reactor shown in FIG. 3.

FIG. 5B is a drawing showing the plasma density n(x) as a function of distance x from the rim of wafer 116. The density is uniform except for a tiny portion 134 near the rim. When compared to the plasma density shown in FIG. 2B, the plasma density shown in FIG. 5B is more uniform across the whole surface of wafer 116.

Figure 5C:
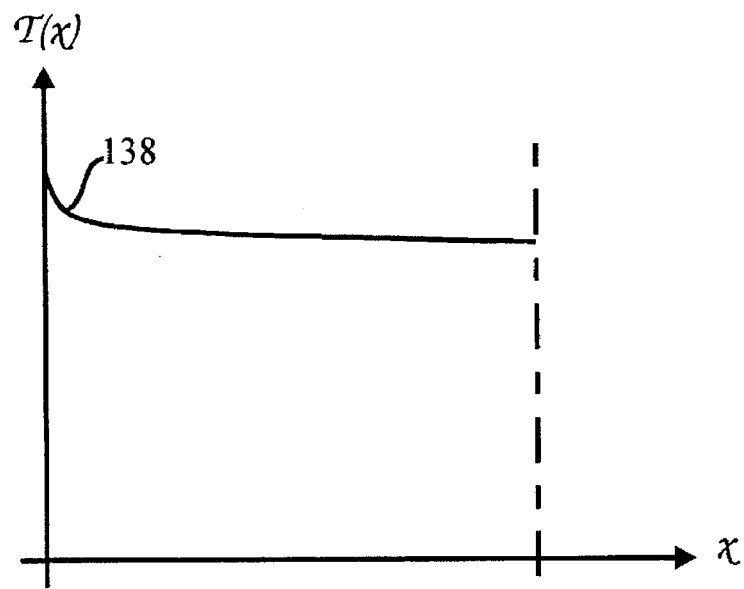
FIG. 5C is a drawing showing the thickness of deposited material on a wafer in a reactor shown in FIG. 3.

FIG. 5C is a drawing showing the thickness T(x) of deposited material on wafer 116 as a function of distance x from the rim of wafer 116. Except for a small region 138, the thickness at the rim of wafer 116 is substantially the same as the thickness at the center. The length of region 138 is much less than 6 mm. Region 138 is not of concern because it is common in the semiconductor industry not to use the area of a wafer which is within 6 mm from the rim of the wafer. Thus, the problem arising from the nonuniformity of the layer shown in FIG. 2C (typically covers a region 15 to 20 mm from the rim of a wafer) is removed.

While the invention has been described above in connection with various embodiments, it is understood that persons skilled in the art can make numerous modifications without departing from the scope of the invention as claimed in the following claims. For example, the above method and means for generating a uniform electric field should not be limited to chemical vapor deposition applications. The same problems of non-uniformity of the electric field, and consequently a non-uniformity in the action of the plasma over the wafer surface and particularly at the edge thereof can occur in etching, and in other deposition methodologies, for example, physical vapor deposition methods. The invention will therefore also find application not only in connection with susceptors in CVD reactors but likewise in connection with pedestals and wafer mounting members in vacuum processing and plasma process chambers for other wafer processing applications.

What is claimed is:

1. A plasma chamber assembly for processing substrates in ionizable gas, comprising:
   a conductive support having a supporting surface for supporting a substrate within the chamber so as to expose a surface of said substrate to the ionizable gas;
   a non-conductive aligning member comprising a lip extending transversely about the periphery of said conductive substrate support; and
   an electrode in facing relationship to said supporting surface, said electrode and said conductive support being adapted to be energized so as to establish an electric field having good uniformity between said electrode and said supporting surface,
   whereby a plasma may be established within said chamber and the processing of said substrate surface may proceed with enhanced uniformity over said surface.

2. An assembly as in claim 1, in which said electrode defines a surface in facing relationship to and coextensive with said conductive substrate supporting surface, said surfaces being substantially parallel to each other.

3. An assembly as in claim 1, which further includes means for directing over said substrate surface gases which decompose under the influence of plasma to deposit a coating across said surface.

4. An assembly as in claim 1, in which said aligning member extends generally about the entire conductive substrate support except for said substrate supporting surface.

5. An assembly as in claim 1, in which said conductive substrate support is a thin plate of generally uniform thickness.

6. An assembly as in claim 1, which further includes means for heating said conductive support.

7. An assembly as in claim 4, in which said aligning member is provided with a plurality of apertures, and in which said assembly further includes one or more sources of optical heat energy directed at said apertures for radiatively heating said conductive support.

8. An assembly as in claim 1, in which said conductive support comprises metal, and said aligning member comprises ceramic.

9. The plasma chamber assembly of claim 1, wherein the non-conductive lip comprises a perimeter that confines the substrate substantially without covering the exposed substrate surface.

10. A plasma chamber for processing substrates in a plasma, the chamber comprising:
   (a) a conductive support having a supporting surface for supporting a substrate;
   (b) one or more radiative heat sources below the conductive support;
   (c) a non-conductive aligning member comprising (i) a lip extending transversely about a periphery of said conductive support, and (ii) a support portion extending below the conductive support, the support portion comprising a plurality of apertures that allow heating of the substrate by radiative heat from the radiative heat sources; and
   (d) an electrode facing the conductive support, the electrode and conductive support adapted to be energized so as to form a uniform electric field therebetween,
   whereby a plasma can be formed in the chamber to process the substrate with enhanced uniformity.

11. The plasma chamber of claim 10, wherein the lip of the non-conductive aligning member extends generally about the entire periphery of the substrate.

12. The plasma chamber of claim 10, wherein the lip of the non-conductive aligning member is made of ceramic.

13. The plasma chamber of claim 12, wherein the lip of the non-conductive aligning member comprises alumina.

14. A plasma deposition reactor for depositing a uniform layer of material across a substrate in a processing environment, the reactor comprising:
   (a) an electrically-conductive susceptor having a surface for supporting the substrate;
   (b) an electrode facing the susceptor surface; and
   (c) non-conductive aligning means for aligning the substrate on the susceptor surface, the aligning means comprising (i) a perimetrically located lip for positioning the substrate on the surface of the electrically conductive susceptor, and (ii) a containment region attached to a perimeter of said lip for accepting said conductive susceptor, the perimeter of the containment region being smaller than the perimeter of the lip,
   wherein the electrode and susceptor are adapted to be energized to establish a relatively uniform electric field between the electrode surface and susceptor to form a plasma in the processing environment.

15. The reactor of claim 14 wherein said non-conductive aligning means includes a plurality of holes.

16. The reactor of claim 15 further comprising a plurality of lamps for heating the substrate, and wherein the holes in the aligning means allow radiative heat transfer of light energy from the lamps to the substrate.

17. The reactor of claim 14 wherein the lip perimeter and the containment region perimeter are both substantially circular.

18. The reactor of claim 14 wherein the non-conductive aligning means comprises a ceramic support.

19. The reactor of claim 14 wherein the electrically conductive susceptor comprises an aluminum susceptor.

20. A plasma chamber for processing a substrate in a plasma of ionizable gas, the chamber comprising:
   (a) an electrically conductive support having a supporting surface for supporting the substrate;
   (b) means for generating an electric field in the chamber; and
   (c) a non-conductive lip extending transversely about a periphery of the substrate, the non-conductive lip shaped and sized to maintain the electric field at the periphery of the substrate substantially uniform and perpendicular to the substrate,
   whereby the ionizable gas ionizes in the uniform electric field to form a plasma that substantially uniformly processes the periphery of the substrate.

21. The plasma chamber of claim 20, wherein the non-conductive lip is shaped and sized so that the thickness of material deposited from a plasma of deposition gas at the periphery of the substrate varies less than about 10% of the thickness of material deposited at an axis of the substrate.

22. The plasma chamber of claim 20, wherein the non-conductive lip extends generally about the entire periphery of the substrate.

23. The plasma chamber of claim 20, wherein the non-conductive lip conforms to the periphery of the substrate to align the substrate on the conductive support.

24. The plasma chamber of claim 20, wherein at least a portion of non-conductive lip is substantially perpendicular to the supporting surface of the conductive support.

25. The process chamber of claim 24, wherein the portion of non-conductive lip substantially perpendicular to the supporting surface of the conductive support comprises a sufficient height above the support to serve as an alignment member for aligning the substrate on the support.

26. The plasma chamber of claim 20, wherein the non-conductive lip comprises a ceramic material.

27. The plasma chamber of claim 26, wherein the non-conductive lip comprises alumina.

28. The plasma chamber of claim 20, wherein the means for generating an electric field comprises an electrode facing the conductive portion of the support; the electrode and support adapted to be energized to generate an electric field therebetween.

29. The plasma chamber of claim 20, wherein the non-conductive lip extends below the conductive support, and wherein the support comprises a plate of metal sized to fit within a perimeter of the lip.

30. The plasma chamber of claim 20, further comprising means for heating the support.

31. The plasma chamber of claim 30 wherein the heating means comprises a radiative heat source below the substrate, and wherein the non-conductive lip extends below the support and comprises a plurality of apertures for exposing the substrate to radiative heat from the radiative heat source.

32. The plasma chamber of claim 20, wherein the non-conductive lip comprises a perimeter that confines the substrate substantially without covering a processing surface of the substrate.

* * * * *